(12) United States Patent
Yajima et al.

(10) Patent No.: US 11,011,309 B2
(45) Date of Patent: May 18, 2021

(54) CERAMIC ELECTRONIC COMPONENT, CERAMIC ELECTRONIC COMPONENT MANUFACTURING METHOD, AND CERAMIC ELECTRONIC COMPONENT-MOUNTING CIRCUIT BOARD

(71) Applicant: Taiyo Yuden Co., Ltd., Tokyo (JP)

(72) Inventors: Shota Yajima, Tokyo (JP); Takashi Sasaki, Tokyo (JP); Tomohiko Zaima, Tokyo (JP); Fukio Kinoshita, Tokyo (JP); Toshiya Kuji, Tokyo (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 19 days.

(21) Appl. No.: 16/597,959

(22) Filed: Oct. 10, 2019

(65) Prior Publication Data

US 2020/0118755 A1    Apr. 16, 2020

(30) Foreign Application Priority Data

Oct. 12, 2018 (JP) .............................. JP2018-193502

(51) Int. Cl.
*H05K 1/18* (2006.01)
*H01G 4/232* (2006.01)
*H01G 4/30* (2006.01)

(52) U.S. Cl.
CPC ............ *H01G 4/232* (2013.01); *H05K 1/181* (2013.01); *H01G 4/30* (2013.01); *H05K 2201/10015* (2013.01); *H05K 2201/10651* (2013.01)

(58) Field of Classification Search
CPC .......... H01G 4/232; H01G 4/30; H05K 1/181; H05K 2201/10651; H05K 2201/10015; H05K 3/3442; H05K 2201/10636; H05K 1/0271

USPC .......................................... 361/306.3
See application file for complete search history.

(56) References Cited

U.S. PATENT DOCUMENTS

| 6,771,485 | B2 * | 8/2004 | Yokoyama | ............. H01G 2/065 361/309 |
| 2011/0102971 | A1 * | 5/2011 | Itamura | .................... H01G 4/12 361/321.2 |
| 2014/0003014 | A1 * | 1/2014 | Hoshi | .................. H05K 3/3442 361/767 |

FOREIGN PATENT DOCUMENTS

JP           2018-193502 A    12/2018

* cited by examiner

*Primary Examiner* — Sherman Ng
(74) *Attorney, Agent, or Firm* — Chip Law Group (57) ABSTRACT

Disclosed is a ceramic electronic component having external electrodes on each of opposed end portions of a rectangular parallelepiped component body. A first direction dimension, a second direction dimension and a third direction dimension of the component body satisfy a condition of second direction dimension>first direction dimension>third direction dimension. The external electrodes are of a five-face type having a first face portion, a second face portion, a third face portion, a fourth face portion and a fifth face portion. At least one edge of the fourth face portion and the fifth face portion of the external electrode has a recess portion recessed from the edge toward the first face portion. Both side portions in the third direction of the recess portion are covering portions which cover ridge portions of the two faces in the second direction of the component body.

19 Claims, 5 Drawing Sheets

CERAMIC ELECTRONIC COMPONENT, CERAMIC ELECTRONIC COMPONENT MANUFACTURING METHOD, AND CERAMIC ELECTRONIC COMPONENT-MOUNTING CIRCUIT BOARD

CROSS REFERENCE TO RELATED APPLICATION

This application is based upon and claims benefit of priority from Japanese Patent Application No. 2018-193502, filed on Oct. 12, 2018, the entire contents of which are incorporated herein by reference.

BACKGROUND

The present disclosure relates to a ceramic electronic component such as a multilayer ceramic capacitor, a manufacturing method for the ceramic electronic component, and a ceramic electronic component-mounting circuit board in which the ceramic electronic component is mounted on a circuit board.

Generally, a ceramic electronic component such as a multilayer ceramic capacitor has external electrodes on each of lengthwise end portions of a rectangular parallelepiped component body satisfying a condition of length direction dimension>width direction dimension, but recently, a so-called LW-reversed type ceramic electronic component is also known, in which a dimensional relationship between the length direction dimension and the width direction dimension is reversed (see FIG. 4 in Japanese Patent Laid-Open No. 2014-146669).

On the other hand, with thinning of electronic apparatuses such as smartphones and notebook computers, ceramic electronic components mounted on circuit boards are required to correspond to low-height mounting (low mounting height). That is, it is necessary to reduce a height direction dimension of a component body for satisfying the above requirements in the LW-reversed type ceramic electronic component.

Incidentally, since the LW-reversed type ceramic electronic component has external electrodes on each of lengthwise end portions of a rectangular parallelepiped component body satisfying a condition of width direction dimension>length direction dimension, a bending strength according to a direction intersecting with the length direction is generally higher than that of a general type ceramic electronic component having the same external dimensions of the component body, in a case of a five-face type external electrode (so-called four-cornered cap shape, having a first face portion formed on one face in a length direction of the component body, a second face portion and a third face portion formed on a part of two faces in a height direction of the component body, and a fourth face portion and a fifth face portion formed on a part of two faces in a width direction of the component body: see FIG. 4 in Japanese Patent Laid-Open No. 2014-146669).

However, even in the case of the LW-reversed type ceramic electronic component (the external electrode is of the aforementioned five-face type), when the height direction dimension of the component body is reduced, e.g., to 150 µm or smaller for satisfying the aforementioned requirements, cracks extends in the height direction especially on the two faces in the width direction of the component body, i.e., a so-called crack extension phenomenon is easily caused due to application of an external force that bends the ceramic electronic component in a direction intersecting with the length direction. As a result, there is a growing concern that the ceramic electronic component has dysfunction.

SUMMARY

It is desirable to provide a ceramic electronic component, a ceramic electronic component manufacturing method, and a ceramic electronic component-mounting circuit board, which can suppress a crack extension phenomenon causable in the component body even in a case where the height direction dimension of the LW-reversed type component body is reduced.

According to an embodiment of the present disclosure, there is provided a ceramic electronic component having external electrodes on each of opposed end portions of a rectangular parallelepiped component body, in which under a condition that a facing direction of opposed two faces of the component body is defined as a first direction, a facing direction of other opposed two faces is defined as a second direction, and a facing direction of the remaining opposed two faces is defined as a third direction, and dimensions along the respective directions are defined as a first direction dimension, a second direction dimension and a third direction dimension, respectively, the first direction dimension, the second direction dimension and the third direction dimension of the component body satisfy a condition of second direction dimension>first direction dimension>third direction dimension, the external electrodes are of a five-face type having a first face portion formed on one face in the first direction of the component body, a second face portion and a third face portion formed on a part of two faces in the third direction of the component body, and a fourth face portion and a fifth face portion formed on a part of two faces in the second direction of the component body, at least one edge of the fourth face portion and the fifth face portion of the external electrode has a recess portion recessed from the edge toward the first face portion, and both side portions in the third direction of the recess portion are covering portions which cover ridge portions of the two faces in the second direction of the component body.

The ceramic electronic component manufacturing method according to the present disclosure is a method for manufacturing the aforementioned ceramic electronic component, in which a process for producing the external electrode includes: forming, on a surface of the component body, a base conductor layer corresponding to the first face portion, the second face portion and the third face portion, and a fourth face portion and a fifth face portion having the recess portions and the covering portions; and forming, on the surface of the base conductor layer, at least one covering conductor layer.

Furthermore, in the ceramic electronic component-mounting circuit board according to the present disclosure, the aforementioned ceramic electronic component is mounted on the circuit board.

The ceramic electronic component, the ceramic electronic component-manufacturing method, and the ceramic electronic component-mounting circuit board according to the present disclosure can suppress the crack extension phenomenon causable in the component body even in a case where the ceramic electronic component is of a LW-reversed type and the height direction dimension of the component body is reduced.

DETAILED DESCRIPTION OF THE PREFERRED EMBODIMENT

For convenience sake, in the following explanation, a facing direction of opposed two faces of a component body 11 depicted in FIGS. 1A, 1B, 1C and 1D (lateral direction in FIG. 1A, FIG. 1B and FIG. 1C) is denoted as "first direction d1," a facing direction of other opposed two faces (vertical direction in FIG. 1A and FIG. 1B, and lateral direction in FIG. 1D) is denoted as "second direction d2," a facing direction of the remaining opposed two faces (vertical direction in FIG. 1C and FIG. 1D) is denoted as "third direction d3."

In addition, a dimension along the first direction d1 of each constituent is denoted as "first direction dimension D1 [symbol of constituent]," a dimension along the second direction d2 is denoted as "second direction dimension D2 [symbol of constituent]," and a dimension along the third direction d3 is denoted as "third direction dimension D3 [symbol of constituent]." Note that, when explaining internal electrode layers 11a, dielectric layers 11b, dielectric margin portions 11c and 11d, external electrodes 12, and the like, a term "thickness" is optionally used for promoting understanding. Incidentally, a numerical value cited as each dimension refers to a design basic dimension and does not include a manufacture dimensional tolerance.

FIGS. 1A, 1B, 1C, 1D, 2A, 2B, 3A, 3B, 4A, 4B, 5 and 6 relate to a ceramic electronic component 10 in which the present disclosure is applied to the multilayer ceramic capacitor. The ceramic electronic component 10 depicted in FIGS. 1A, 1B, 1C, 1D, 2A, 2B, 3A, 3B, 4A, 4B, 5 and 6 falls under the LW-reversed type described in BACKGROUND, also corresponds to low-height mounting (low mounting height), and has the external electrodes 12 on each end portion in the first direction d1 of the rectangular parallelepiped component body 11.

A first direction dimension D1 [11], a second direction dimension D2 [11] and a third direction dimension D3 [11] of the component body 11 satisfy a condition of second direction dimension D2 [11]>first direction dimension D1 [11]>third direction dimension D3 [11]. Incidentally, each corner portion (symbol is omitted) and each ridge portion RP of the component body 11 are somewhat rounded.

Figure 1A:
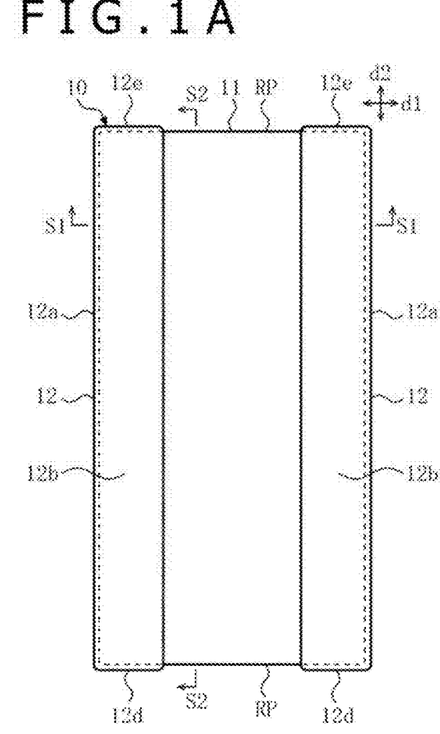
FIG. 1A is a top view of a ceramic electronic component (multilayer ceramic capacitor) according to an embodiment of the present disclosure.
Figure 1B:
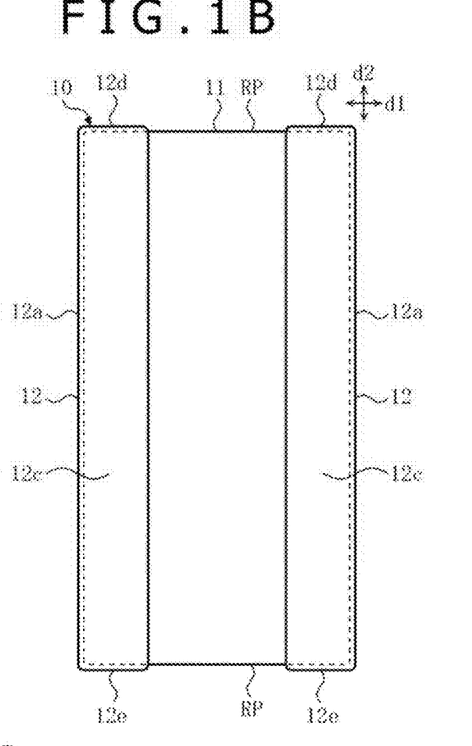
FIG. 1B is a bottom view of the ceramic electronic component (multilayer ceramic capacitor) according to the embodiment of the present disclosure.
Figure 1C:
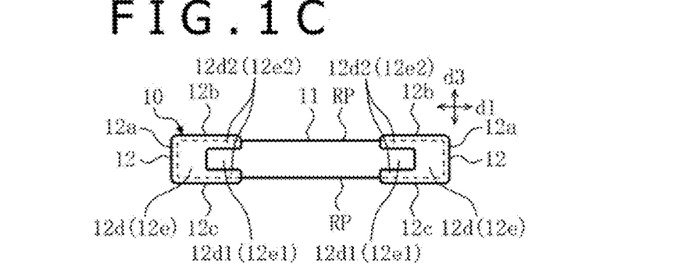
FIG. 1C is a side view in a second direction d2 of the ceramic electronic component (multilayer ceramic capacitor) according to the embodiment of the present disclosure.
Figure 1D:
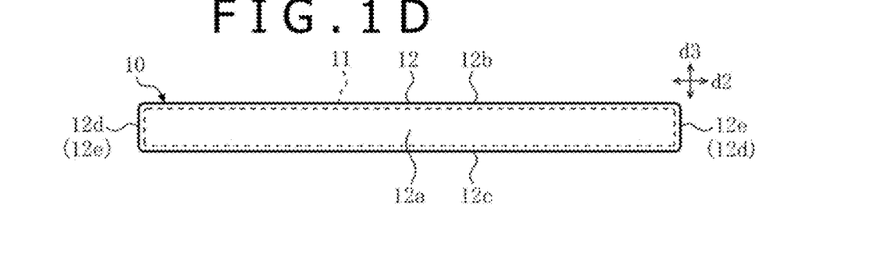
FIG. 1D is a side view in a first direction d1 of the ceramic electronic component (multilayer ceramic capacitor) according to the embodiment of the present disclosure.
Figure 2A:
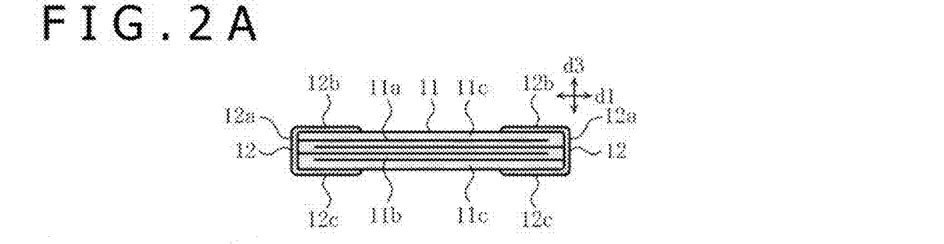
FIG. 2A is a sectional view along line S1-51 of FIG. 1A.
Figure 2B:
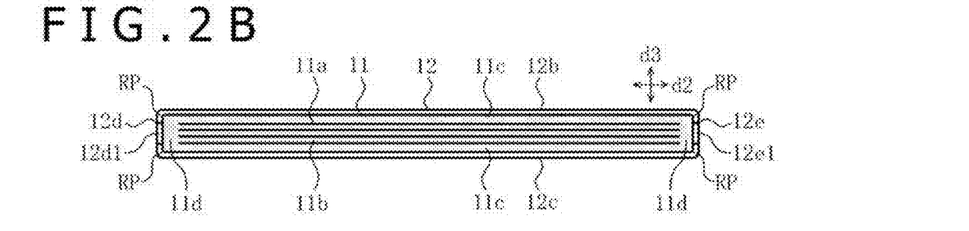
FIG. 2B is a sectional view along line S2-S2 of FIG. 1A.
Figure 3A:
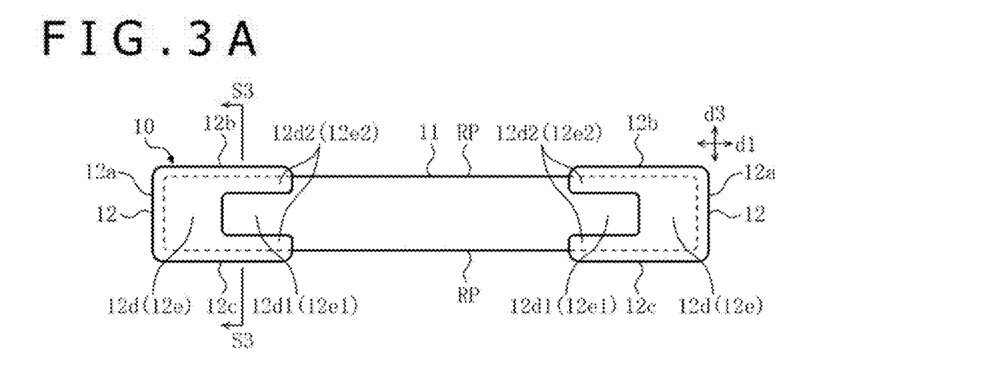
FIG. 3A is an enlarged view of FIG. 1C.
Figure 3B:
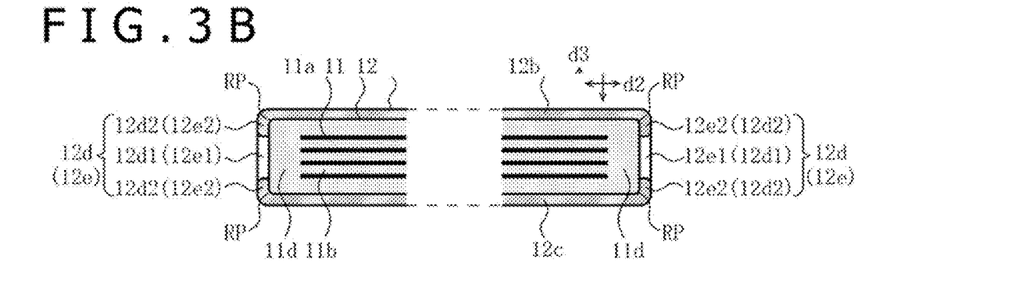
FIG. 3B is a sectional view along line S3-S3 of FIG. 3A.

In addition, the component body 11 incorporates a capacitive portion (symbol is omitted) as a functional portion in which a plurality of rectangular internal electrode layers 11a are laminated in the third direction d3 through the dielectric layers 11b. As depicted in FIG. 2A and FIG. 2B, this capacitive portion is surrounded by the dielectric margin portions 11c on the both sides in the third direction d3 and dielectric margin portions 11d on the both sides in the second direction d2.

Furthermore, as depicted in FIG. 2A, the plurality of internal electrode layers 11a are alternately shifted in the first direction d1, and one edge in the first direction d1 of the internal electrode layer 11a odd-numbered from the top in FIG. 2A is connected to a first face portion 12a of one external electrode 12, and the other edge in the first direction d1 of the internal electrode layer 11a even-numbered from the top in FIG. 2A is connected to the first face portion 12a of the other external electrode 12.

The third direction dimension D3 [11] of the component body 11 can be, e.g., within a range of 60 to 120 μm, or 25 to 60 μm in consideration of low-height mounting (low mounting height) of the ceramic electronic component 10. The first direction dimension D1 [11] and the second direction dimension D2 [11] of the component body 11 are not particularly limited in light of the relationship with low-height mounting (low mounting height) of the ceramic electronic component 10. However, in light of a balance with the third direction dimension D3 [11], the first direction dimension D1 [11] can be, e.g., within a range of 200 to 800 μm, and the second direction dimension D2 [11] can be, e.g., within a range of 400 to 1600 μm.

Thicknesses of the internal electrode layer 11a and the dielectric layer 11b can be, e.g., within a range of 0.3 to 4 μm in consideration of low-height mounting (low mounting height) of the ceramic electronic component 10. Thicknesses of the dielectric margin portions 11c and 11d can be, e.g., within a range of 3 to 30 μm in consideration of low-height mounting (low mounting height) of the ceramic electronic component 10.

Incidentally, a first direction dimension D1 [11a] and a second direction dimension D2 [11a] of the internal electrode layer 11a, and the total number of the internal electrode layers 11a can be arbitrarily changed depending on external dimensions, a desired capacitance value, and the like of the ceramic component body 11. The desired capacitance value of the ceramic electronic component 10 corresponding to low-height mounting (low mounting height) can be, e.g., within a range of 0.1 to 0.3 μF, or 0.3 to 1.0 μF.

Examples of main ingredients of the dielectric layer 11b and the dielectric margin portions 11c and 11d include dielectric ceramics such as barium titanate, strontium titanate, calcium titanate, magnesium titanate, calcium zirconate, calcium titanate zirconate, barium zirconate, and titanium oxide. Examples of the main ingredient of the internal electrode layer 11a include metals such as nickel, copper, palladium, platinum, silver, gold, and an alloy thereof.

Incidentally, the main ingredient of the dielectric layer 11b and the main ingredient of the dielectric margin portion 11c may be different from each other, or otherwise the main ingredient of the dielectric layer 11b, the main ingredient of the dielectric margin portion 11c on one side in the third direction d3, and the main ingredient of the dielectric margin portion 11c on the other side in the third direction d3 may be different from each other.

On the other hand, the external electrode 12 is of a five-face type having the first face portion 12a formed on one face in the first direction d1 of the component body 11, a second face portion 12b and a third face portion 12c formed on a part of two faces in the third direction d3 of the component body 11, and a fourth face portion 12d and a fifth face portion 12e formed on a part of two faces in the second direction d2 of the component body 11. That means, in the ceramic electronic component 10, any face in the third direction d3 can be used as a mounting face (connection face). Incidentally, in a view of the second face portion 12b and the third face portion 12c from the third direction d3, the two corner portions (symbol is omitted) on the side of the first face portion 12a are slightly rounded (e.g., a curvature radius is within a range of 10 to 150 μm), or otherwise tapered commensurately with the roundness.

As will be explained later with reference to FIGS. 8A, 8B and 8C, the roundness of the two corner portions on the edge sides of the second face portion 12b and the third face portion 12c can be formed larger than the roundness of the two corner portions on the side of the first face portion 12a.

Maximum values of a first direction dimension D1 [12b] of the second face portion 12b, a first direction dimension D1 [12c] of the third face portion 12c, and a first direction dimension D1 [12d] of the fourth face portion 12d are equal to or substantially equal to a maximum value of a first direction dimension D1 [12e] of the fifth face portion 12e.

As will be explained later with reference to FIGS. 8A, 8B and 8C, first direction dimensions D1 [12b'&12c'] of a second face portion 12b' and a third face portion 12c' can be made larger than the first direction dimensions D1 [12d&12e] of the fourth face portion 12d and the fifth face portion 12e.

In addition, at least one of or preferably both of the edges of the fourth face portion 12d and the fifth face portion 12e have recess portions 12d1 and 12e1 recessed from the edges toward the first face portion 12a. Both side portions in the third direction d3 of the recess portions 12d1 and 12e1 are covering portions 12d2 and 12e2 for covering the ridge portions RP on the two faces in the second direction d2 of the component body 11.

That means, since the fourth face portion 12d is continuous with the second face portion 12b and the third face portion 12c, the continuous part is the covering portion 12d2 for covering the ridge portion RP, and since the fifth face portion 12e is also continuous with the second face portion 12b and the third face portion 12c, the continuous part is the covering portion 12e2 for covering the ridge portion RP.

Incidentally, a shape of the recess portions 12d1 and 12e1 viewed from the second direction d2 is rectangular.

As will explained later with reference to FIGS. 7A and 7B, recess portions 12d3 and 12e3 and recess portions 12d5 and 12e5 viewed from the second direction d2 may be V-shaped or U-shaped.

Furthermore, the recess portion 12d1 is preferably formed at the middle in the third direction d3 of the edge of the fourth face portion 12d, and the recess portion 12e1 is preferably formed at the middle in the third direction d3 of the edge of the fifth face portion 12e. The reason why it is preferable to form the recess portion at the middle of the third direction d3 is because third direction dimensions D3 [12d2] of the covering portions 12d2 present on both sides in the third direction d3 of the recess portion 12d1 should be equal to each other as much as possible, and the third direction dimensions D3 [12e2] of the covering portions 12e2 present on both sides in the third direction d3 of the recess portion 12e1 should be equal to each other as much as possible.

The first direction dimensions D1 [12b, 12c, 12d&12e] of the second face portion 12b, the third face portion 12c, the fourth face portion 12d, and the fifth face portion 12e can be, e.g., within a range of 1/10 to 4/10 of the first direction dimension D1 [11] of the component body 11.

In a case where the ceramic electronic component 10 is mounted on a circuit board CB (see FIG. 5), the second face portion 12b or the third face portion 12c faces a conductive pad CBa of the circuit board CB, and therefore the first direction dimensions D1 [12b&12c] of the second face portion 12b and the third face portion 12c are preferably ensured to be at least 50 μm. In addition, for the purpose of avoiding short-circuiting between the second face portions 12b or between the third face portions 12c due to a solder SOL in the soldering process during mounting, a distance between the second face portions 12b in the first direction and a distance between the third face portions 12c in the first direction are preferably ensured to be at least 100 μm.

First direction dimensions D1 [12d1&12e1] of the recess portions 12d1 and 12e1 can be, e.g., within a range of 5% to 95% of the first direction dimensions D1 [12d&12e] of the fourth face portion 12d and the fifth face portion 12e. When the first direction dimensions D1 [12d1&12e1] of the recess portions 12d1 and 12e1 are smaller than 5% of the first direction dimensions D1 [12d&12e] of the fourth face portion 12d and the fifth face portion 12e, an effect described below (suppression of crack extension) is hardly obtained, and when they are larger than 95%, area ratios of the recess portions 12d1 and 12e1 are large, and therefore a desired strength of the fourth face portion 12d and the fifth face portion 12e is hardly obtained.

When emphasizing suppression of the crack extension, the first direction dimensions D1 [12d1&12e1] of the recess portions 12d1 and 12e1 are within a range of 5% to 15%, preferably 15% to 65%, more preferably 65% to 95% of the first direction dimensions D1 [12d&12e] of the fourth face 12d portion and the fifth face portion 12e.

The ranges of the third direction dimensions D3 [12d1&12e1] of the open ends of the recess portions 12d1 and 12e1 are not particularly limited as long as they are smaller than the third direction dimensions D3 [12d&12e] of the fourth face portion 12d and the fifth face portion 12e, in other words, as long as the covering portions 12d2 and 12e2 are present on both sides in the third direction d3 of the recess portions 12d1 and 12e1. In addition, the third direction dimensions at the middle in the first direction between the open end and the impasse portion of the recess portions 12d1 and 12e1 are preferably 40% to 95%, more preferably 50% to 85% of the third direction dimensions of the fourth face portion 12d and the fifth face portion 12e.

Thicknesses of the first face portion 12a, the second face portion 12b, the third face portion 12c, the fourth face portion 12d, and the fifth face portion 12e of the external electrode 12 can be, e.g., within a range of 10 to 18 μm, or 2 to 10 μm in consideration of low-height mounting (low mounting height) of the ceramic electronic component 10.

In addition, the external electrode 12 has a multilayer structure including a base conductor layer and at least one covering conductor layer for covering the surface of the base conductor layer. The number of the covering conductor layer is not particularly limited, but may be, e.g., 1 to 4 in light of a balance with the thickness of each face portion 12a to 12e of the external electrode 12. The main ingredient of the external electrode 12 will be explained in the following examples of a manufacturing method including a layer configuration and a formation procedure.

Herein, a preferable example of the manufacturing method for the aforementioned ceramic electronic component 10, particularly a preferable example of the production method for the external electrode 12 will be explained.

The ceramic electronic component 10 is manufactured mainly by a process for producing the component body 11, and a process for producing the external electrodes 12 on each end portion in the first direction dl of the component body 11.

The process for producing the component body 11 includes: a step of forming a multiple-patterning unbaked multilayer sheet by appropriately laminating and pressure-bonding a ceramic green sheet having no internal electrode layer pattern and a ceramic green sheet having the internal electrode layer pattern; a step of forming a unbaked chip corresponding to the component body 11 by chopping the unbaked multilayer sheet; a step of grinding the unbaked chip; and a step of baking the unbaked chip under an atmosphere and temperature profile according to a ceramic material and a metal material.

The process of producing the external electrode 12 includes: a step of forming the base conductor layer on the surface of the component body; and a step of forming at least one covering conductor layer on the surface of the base conductor layer. In a case where there are two or more covering conductor layers, the first covering conductor layer is formed on the surface of the base conductor layer, and the second and subsequent covering conductor layers are sequentially formed on the surface of the antecedently formed covering conductor layer.

As an example, a case where the external electrode 12 has a four-layer configuration will be explained in detail with reference to FIGS. 4A and 4B (internal electrode layers 11a are not illustrated). First, a base conductor layer CF1 having a shape corresponding to the first face portion 12a, the second face portion 12b, the third face portion 12c, the fourth face portion 12d, and the fifth face portion 12e is formed on the surface of the component body 11. A shape of a recess portion CF1a of the base conductor layer CF1 viewed from the second direction d2 is slightly smaller than the recess portions 12d1 and 12e1 of the fourth face portion 12d and the fifth face portion 12e. Then, a first covering conductor layer CF2 is formed on the surface of the base conductor layer CF1, a second covering conductor layer CF3 is formed on the surface of the first covering conductor layer CF2, and a third covering conductor layer CF4 is formed on the surface of the second covering conductor layer CF3.

For forming the base conductor layer CF1 and the respective covering conductor layers CF2 to CF4, the following methods can be selectively adopted: a so-called baking method in which a metal paste containing at least a metal powder, an organic solvent and a synthetic resin binder is applied by a procedure such as a screen printing method and a dipping method, dried and then baked; a dry plating method such as sputtering and vacuum deposition; and a wet plating method such as electroplating or electroless plating. In light of a balance with the thicknesses of the respective face portions 12a to 12e of the external electrode 12, particularly with the thicknesses of the second face portion 12b and the third face portion 12c, it is preferable that the base conductor layer CF1 is formed by using the baking method and sputtering in combination or by sputtering, and the respective covering conductor layers CF2 to CF4 are formed by electroplating in consideration of mass productivity.

In a case where forming the base conductor layer CF1 by using the baking method and sputtering in combination, the main ingredients of the baked film and the sputtered film can be, e.g., metals such as copper, nickel, silver, gold, platinum, palladium, tin, chromium, titanium, tantalum, tungsten, molybdenum, and an alloy thereof.

Figure 4A:
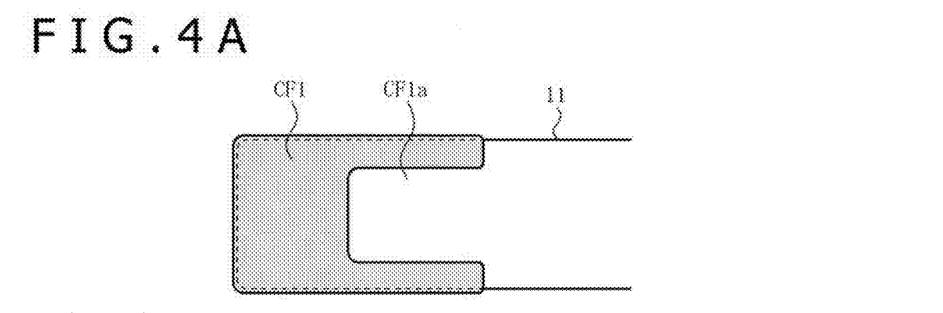
FIG. 4A and FIG. 4B are drawings for illustrating an example of an external electrode producing method.
Figure 4B:
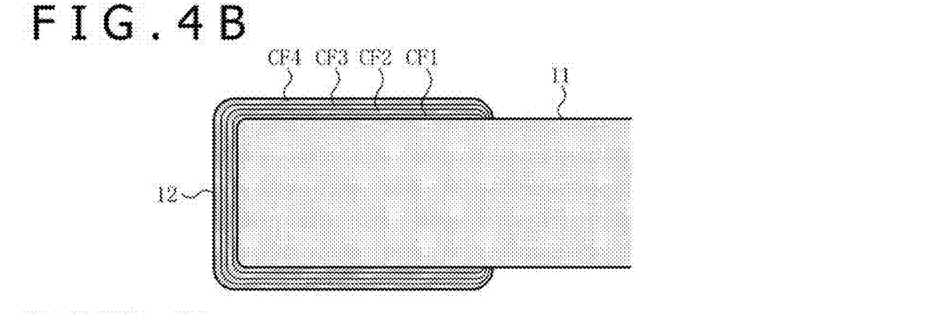

When forming the base conductor layer CF1 by using the baking method and sputtering in combination, first, a baked film is formed on one face in the first direction d1 of the component body 11 so that the periphery portion slightly wraps two faces in the second direction d2 and two faces in the third direction d3, and subsequently a sputtered film which is continuous with the baked film and has the recess portion CF1a depicted in FIG. 4A is formed on the two faces in the second direction d2 and the two faces in the third direction d3 of the component body 11, and this sputtered film is used as the base conductor layer CF1. In a case where a desired sputtered film is hardly formed by single sputtering, the sputtering may be conducted twice or more by changing the direction of the component body 11, or the like.

On the other hand, in a case where the base conductor layer CF1 is formed by sputtering, the main ingredient of the sputtered film can be, e.g., the same metal as described above.

When forming the base conductor layer CF1 by sputtering, a sputtered film having the recess portion CF1a depicted FIG. 4A is formed on one face in the first direction d1, two faces in the second direction d2, and two faces in the third direction d3 of the component body 11, and this sputtered film is used as the base conductor layer CF1. In a case where a desired sputtered film is hardly formed by single sputtering, the sputtering may be conducted twice or more by changing the direction of the component body 11, or the like.

There is no remarkable quality difference between the case of forming the base conductor layer CF1 by using the baking method and sputtering in combination and the case of forming the base conductor layer CF1 by sputtering. However, so to speak, in the former case, an adhesiveness of the base conductor layer CF1 to the component body 11 can be enhanced by the baked film included in the base conductor layer CF1. On the other hand, in the latter case, the base conductor layer CF1 can be formed only by sputtering, contributing to reduction of steps.

In a case where the respective covering conductor layers CF2 to CF4 are formed by electroplating, the main ingredient of the respective covering conductor CF2 to CF4 can be, e.g., the same main ingredient as of the base conductor layer CF1, but, in consideration of mutual adhesiveness, the main ingredient of the first covering conductor layer CF2 may be different from the main ingredient of the base conductor layer CF1, the main ingredient of the second covering conductor layer CF3 may be different from the main ingredient of the first covering conductor layer CF2, and the main ingredient of the third covering conductor layer CF3 may be different from the main ingredient of the second covering conductor layer CF2.

As an example, the main ingredient can be a combination of nickel as the main ingredient of the base conductor layer CF1, copper as the main ingredient of the first covering conductor layer CF2, nickel as the main ingredient of the second covering conductor layer CF3, tin as the main ingredient of the third covering conductor layer CF4.

Also in a case where the external electrode 12 has a two-layer configuration, a three-layer configuration, or a five-layer configuration different from the aforementioned four-layer configuration, the formation method and the main ingredients of the base conductor layer and the covering conductor layer are the same as in the four-layer configuration. In a case where the external electrodes 12 are connected to the conductive pad CBa of the circuit board CB using the solder SOL (see FIG. 5), the main ingredient of the outermost covering conductor layer of the external electrode 12 having a two- to five-layer configuration is preferably tin which is most compatible with solder.

Figure 5:
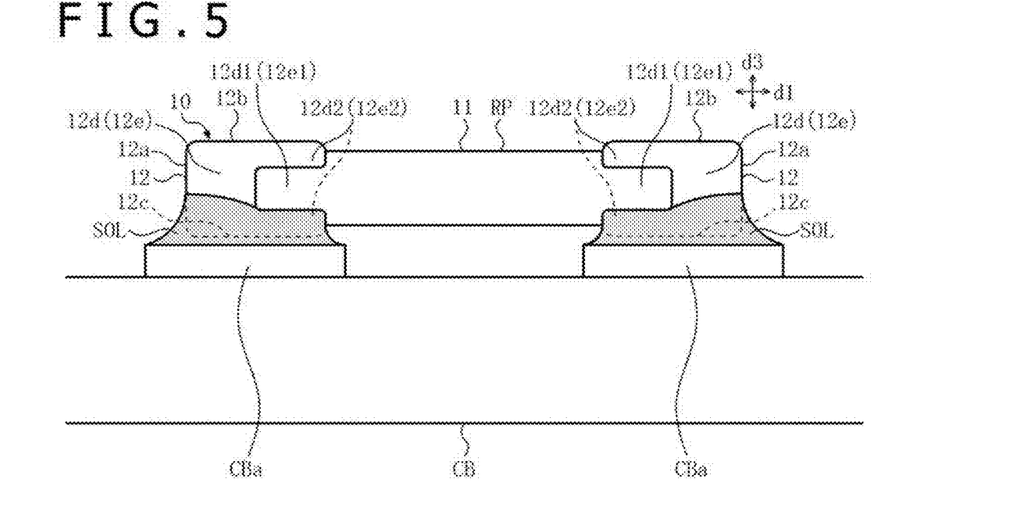
FIG. 5 is a drawing for illustrating an example of a method for mounting the ceramic electronic component depicted in FIGS. 1A, 1B, 1C and 1D on a circuit board.

When the aforementioned ceramic electronic component 10 is mounted on the circuit board CB, a soldering paste is applied to conductive pads CBa corresponding to the external electrodes 12 disposed on the circuit board CB by printing or the like, and the ceramic electronic component 10 is installed so that the third face portion 12c of the external electrode 12 contacts the soldering paste, as depicted in FIG. 5 (a case where the lower face in FIG. 5 in the third direction d3 of the ceramic electronic component 10 is used as the mounting face). Subsequently, the circuit board CB equipped with the ceramic electronic component 10 is put into a reflow furnace (not depicted in the figure), and then, through a preheating step, a main heating step and a cooling step, the external electrodes 12 are connected to the conductive pad CBa via the solder SOL.

Figure 6:
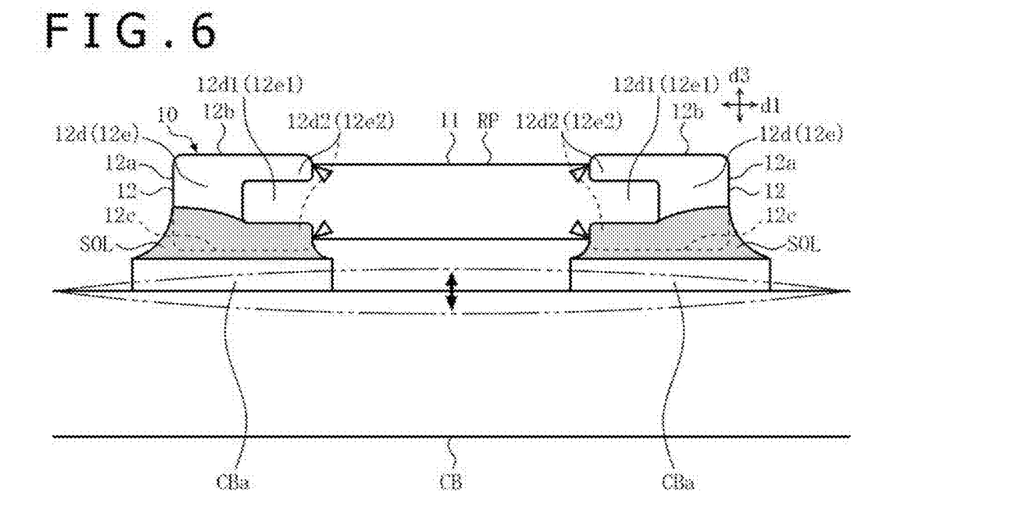
FIG. 6 is a drawing for illustrating an effect obtained by the ceramic electronic component depicted in FIGS. 1A, 1B, 1C and 1D.

In the aforementioned ceramic electronic component 10 mounted on the circuit board CB, as depicted in FIG. 6, when an external force is applied to the ceramic electronic component 10 so as to bend the ceramic electronic component 10 in a direction intersecting with the first direction d1 due to deflection of the circuit board CB (see two-dot chain lines in FIG. 6) and the like based on thermal expansion/contraction, external force application, or the like, stress concentrates to positions marked with x on the ceramic electronic component 10 in FIG. 6.

Although the stress concentration can generally cause cracks, stress transmission in the third direction d3 can be dispersed by the recess portions 12d1 and 12e1 even if the stress concentrates to the positions marked with x in FIG. 6, because the recess portions 12d1 and 12e1 recessed from the edge toward the first face portion 12a are formed on at least one edge, preferably both edges of the fourth face portion 12d and the fifth face portion 12e of the external electrode 12. Thus, it is hard to cause a so-called crack extension phenomenon in which cracks extend straight in the third direction d3 on two faces in the second direction d2 of the component body 11.

Furthermore, in a case where the recess portions 12d1 and 12e1 are on at least one edge, preferably both edges of the fourth face portion 12d and the fifth face portion 12e of the external electrode 12, the molten solder spreads up to the surfaces of the recess portions 12d2 and 12e2 of the fourth face portion 12d and the fifth face portion 12e, but the up-spreading is likely to be blocked by the recess portions 12d1 and 12e1. That means, in a case where the up-spreading is blocked, the solder SOL adheres to the surfaces of the fourth face portion 12d and the fifth face portion 12e of the external electrode 12 while avoiding the recess portions 12d1 and 12e1, as depicted in FIG. 5. Thus, this aspect can mitigate transmission in the third direction d3 of the stress concentrating to the positions marked with x in FIG. 6, and further suppress occurrence of the crack extension phenomenon.

In addition, in a case where the recess portions 12d1 and 12e1 are on at least one edge, preferably on both edges of the fourth face portion 12d and the fifth face portion 12e of the external electrode 12, the solder SOL bridges between the fourth face portions 12d or between the fifth face portions 12e to enhance a possibility to avoid conduction between the fourth face portion 12d and the fifth face portion 12e via the recess portions 12d1 and 12e1 in the soldering process, and also enhance a possibility to avoid conduction between the fourth face portion 12d and the fifth face portion 12e via the recess portions 12d1 and 12e1 on the basis of the migration.

Furthermore, in a case where the recess portions 12d1 and 12e1 are on at least one edge, preferably on both edges of the fourth face portion 12d and the fifth face portion 12e of the external electrode 12, the ridge portions RP on the two faces in the second direction of the component body 11 can be prevented from cracking compared to the case of no covering portions 12d2 and 12e2 in a distribution process, a mounting process or the like of the ceramic electronic component 10, because the covering portions 12d2 and 12e2 for covering the ridge portions RP of the two faces in the second direction d2 of the component body 11 along the ridge portions RP are disposed on the both sides in the third direction d3.

Figure 7A:
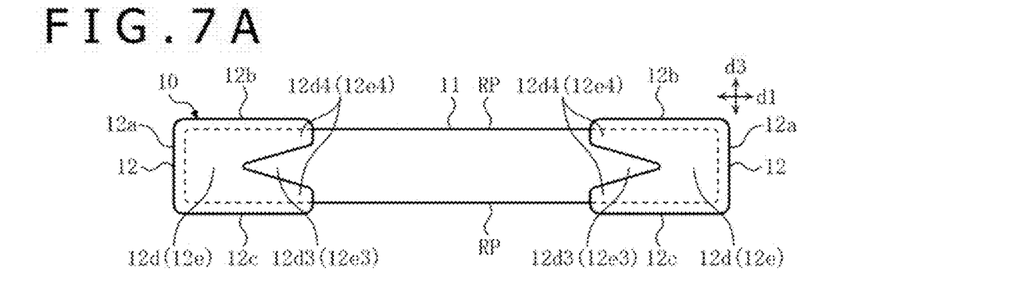
FIG. 7A and FIG. 7B are drawings depicting modification examples of a shape of a recess portion on the external electrode depicted in FIGS. 1A, 1B, 1C and 1D.
Figure 7B:
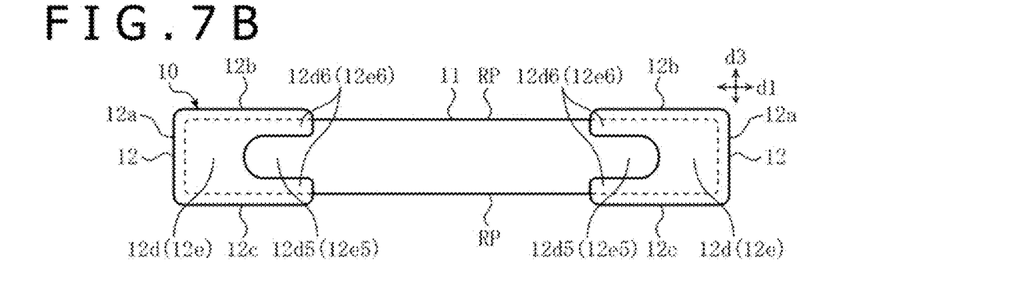

FIGS. 7A and 7B depict modification examples of the shapes of the recess portions 12d1 and 12e1 formed on the fourth face portion 12d and the fifth face portion 12e of the external electrode 12 of the ceramic electronic component 10. The recess portions 12d3 and 12e3 viewed from the second direction d2 depicted in FIG. 7A are V-shaped, and shapes of covering portions 12d4 and 12e4 on both sides in the third direction d3 are also slightly changed along with the V-shape. To explain the V-shape in other words, an angle formed by two straight lines running from the open end toward the end portion in the first direction is less than 90 degrees in the recess portion. In addition, the recess portions 12d5 and 12e5 viewed from the second direction d2 depicted in FIG. 7B are U-shaped, and shapes of covering portions 12d6 and 12e6 on both sides in the third direction d3 are also slightly changed along with the U-shape. To explain the U-shape in other words, the impasse portion is curved on the recess portion.

In a case where the rectangular recess portions 12d1 and 12e1 formed on the fourth face portion 12d and the fifth face portion 12e of the external electrode 12 of the aforementioned ceramic electronic component 10 are replaced by the V-shaped recess portions 12d3 and 12e3 depicted in FIG. 7A, and also replaced by the U-shaped recess portions 12d5 and 12e5 depicted in FIG. 7B, the same effect as described above can be obtained.

Figure 8A:
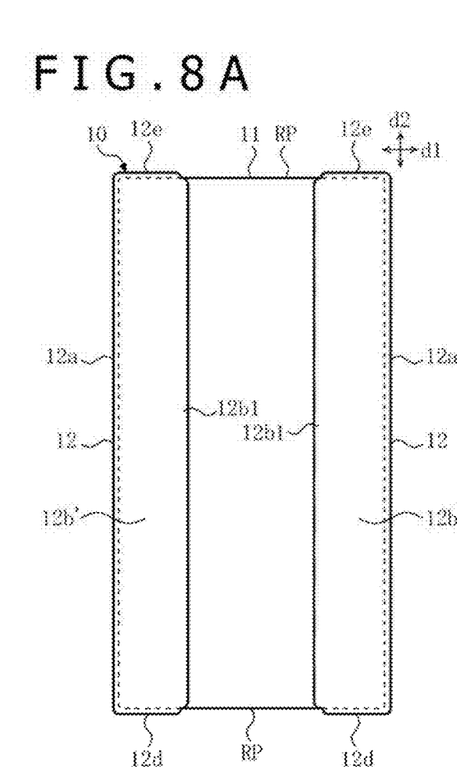
FIGS. 8A, 8B and 8C are drawings depicting modification examples of shapes of a second face portion and a third face portion on the external electrode depicted in FIGS. 1A, 1B, 1C and 1D.
Figure 8B:
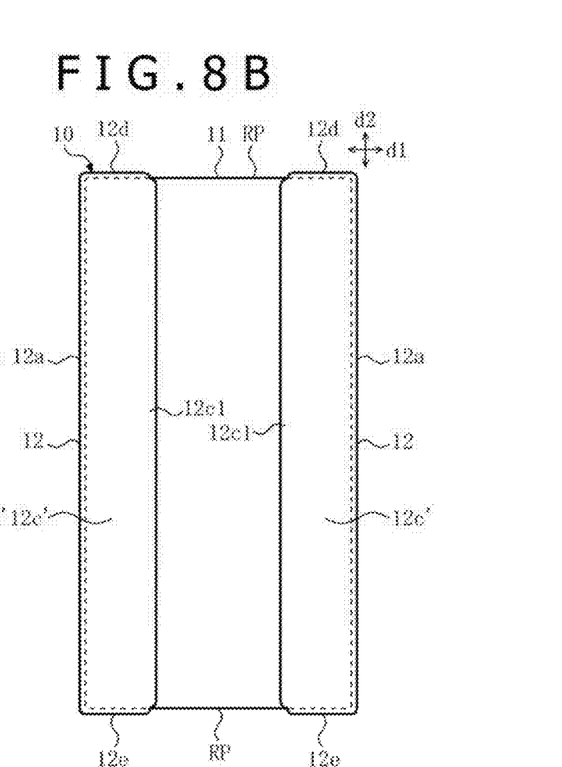
Figure 8C:
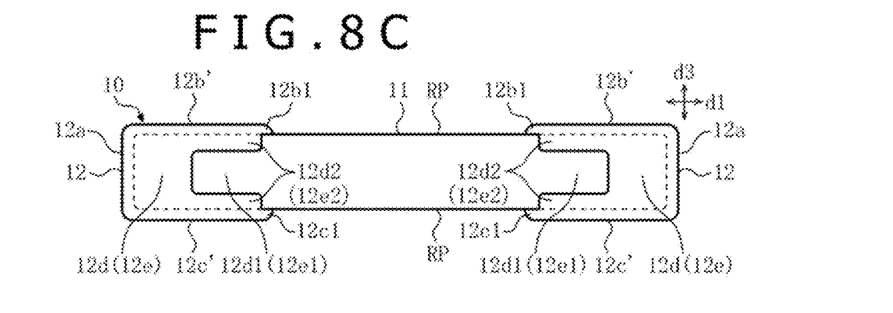

FIGS. 8A, 8B and 8C depict modification examples of the shapes of the second face portion 12b and the third face portion 12c of the external electrode 12 of the ceramic electronic component 10. The first direction dimensions D1 [12b'&12c'] of the second face portion 12b' and the third face portion 12c' depicted in FIGS. 8A, 8B and 8C are larger than the first direction dimensions D1 [12d&12e] of the fourth face portion 12d and the fifth face portion 12e. Ranges of values obtained by subtracting the first direction dimensions D1 [12d&12e] from the first direction dimensions D1 [12b'&12c'], i.e., ranges of first direction dimensions D1 [12b1&12c1] of an overhang portion 12b1 of the second face portion 12b' and an overhang portion 12c1 of the third face portion 12c' can be, e.g., 1/20 to 1/2 of the first direction dimensions D1 [12d&12e] of the fourth face portion 12d and the fifth face portion 12e.

In addition, in a case where the first direction dimensions D1 [12b'&12c] of the second face portion 12b' and the third face portion 12c' are larger than the first direction dimensions D1 [12d&12e] of the fourth face portion 12d and the fifth face portion 12e, the roundness of the two corners (symbol is omitted) on the edge sides of the second face portion 12b' and the third face portion 12c' can be made larger than the roundness of the two corners (symbol is omitted) on the side of the first face portion 12a.

Even in a case where the second face portion 12b and the third face portion 12c of the external electrode 12 on the aforementioned ceramic electronic component 10 are changed to the second face portion 12b' and the third face portion 12c' depicted in FIGS. 8A, 8B and 8C, the same effect as described above can be obtained.

Although the ceramic electronic component 10 in which the present disclosure is applied to the multilayer ceramic capacitor has been explained above, the present disclosure can also be applied to ceramic electronic components other than the multilayer ceramic capacitor, e.g., a multilayer ceramic varistor, a multilayer ceramic inductor, or the like. That means, as long as the ceramic electronic component falls under the LW-reversed type described in BACKGROUND and also corresponds to the low-height mounting (low mounting height), the present disclosure can be applied to the ceramic electronic component to obtain the same effect as described above.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2018-193502 filed in the Japan Patent Office on Oct. 12, 2018, the entire content of which is hereby incorporated by reference.

What is claimed is:

1. A ceramic electronic component having external electrodes on each of opposed end portions of a rectangular parallelepiped component body, wherein
   under a condition that a facing direction of opposed two faces of the component body is defined as a first direction, a facing direction of other opposed two faces is defined as a second direction, and a facing direction of the remaining opposed two faces is defined as a third direction, and dimensions along the respective directions are defined as a first direction dimension, a second direction dimension and a third direction dimension, respectively,
   the first direction dimension, the second direction dimension and the third direction dimension of the component body satisfy a condition of second direction dimension>first direction dimension>third direction dimension,
   the external electrodes are of a five-face type having a first face portion formed on one face in the first direction of the component body, a second face portion and a third face portion formed on a part of two faces in the third direction of the component body, and a fourth face portion and a fifth face portion formed on a part of two faces in the second direction of the component body,
   at least one edge of the fourth face portion and the fifth face portion of the external electrode has a recess portion recessed from the edge toward the first face portion, and
   both side portions in the third direction of the recess portion are covering portions which cover ridge portions of the two faces in the second direction of the component body.

2. The ceramic electronic component according to claim 1, wherein the recess portions are formed at a middle in the third direction of the edges of the fourth face portion and the fifth face portion.

3. The ceramic electronic component according to claim 1, wherein first direction dimensions of the recess portions are within a range of 5% to 15% of first direction dimensions of the fourth face portion and the fifth face portion.

4. The ceramic electronic component according to claim 1, wherein the first direction dimensions of the recess portions are within a range of 15% to 65% of the first direction dimensions of the fourth face portion and the fifth face portion.

5. The ceramic electronic component according to claim 1, wherein the first direction dimensions of the recess portions are within a range of 65% to 95% of the first direction dimensions of the fourth face portion and the fifth face portion.

6. The ceramic electronic component according to claim 1, wherein third direction dimensions of open ends of the recess portions are smaller than third direction dimensions of the fourth face portion and the fifth face portion.

7. The ceramic electronic component according to claim 1, wherein the recess portion viewed from the second direction is rectangular.

8. The ceramic electronic component according to claim 1, wherein the recess portion viewed from the second direction is V-shaped.

9. The ceramic electronic component according to claim 1, wherein the recess portion viewed from the second direction is U-shaped.

10. The ceramic electronic component according to claim 1, wherein the third direction dimension of the component body is within a range of 60 to 120 μm.

11. The ceramic electronic component according to claim 1, wherein the third direction dimension of the component body is within a range of 25 to 60 μm.

12. The ceramic electronic component according to claim 1, wherein first direction dimensions of the second face portion and the third face portion are larger than the first direction dimensions of the fourth face portion and the fifth face portion.

13. The ceramic electronic component according to claim 1, wherein the ceramic electronic component includes a multilayer ceramic capacitor.

14. The ceramic electronic component according to claim 13, wherein a capacitance value of the ceramic capacitor is within a range of 0.1 to 0.3 μF.

15. The ceramic electronic component according to claim 13, wherein the capacitance value of the ceramic capacitor is within a range of 0.3 to 1.0 μF.

16. A manufacturing method for a ceramic electronic component having external electrodes on each of opposed end portions of a rectangular parallelepiped component body,
   under a condition that a facing direction of opposed two faces of the component body is defined as a first direction, a facing direction of other opposed two faces is defined as a second direction, and a facing direction of the remaining opposed two faces is defined as a third direction, and dimensions along the respective directions are defined as a first direction dimension, a second direction dimension and a third direction dimension, respectively,
   the first direction dimension, the second direction dimension and the third direction dimension of the component body satisfying a condition of second direction dimension>first direction dimension>third direction dimension, the external electrodes being of a five-face type having a first face portion formed on one face in the first direction of the component body, a second face portion and a third face portion formed on a part of two faces in the third direction of the component body, and a fourth face portion and a fifth face portion formed on a part of two faces in the second direction of the component body, at least one edge of the fourth face portion and the fifth face portion of the external electrode having a recess portion recessed from the edge toward the first face portion, both side portions in the third direction of the recess portion being covering portions which cover ridge portions of the two faces in the second direction of the component body, wherein a process for producing the external electrodes includes:

forming, on a surface of the component body, a base conductor layer corresponding to the first face portion, the second face portion and the third face portion, and a fourth face portion and a fifth face portion having the recess portions and the covering portions; and forming, on the surface of the base conductor layer, at least one covering conductor layer.

17. The ceramic electronic component manufacturing method according to claim 16, wherein the number of the covering conductor layers is two or more, and a second and subsequent covering conductor layers are sequentially formed on a surface of the antecedently formed covering conductor layer.

18. A ceramic electronic component-mounting circuit board, wherein a ceramic electronic component is mounted on a circuit board, the ceramic electronic component having external electrodes on each of opposed end portions of a rectangular parallelepiped component body, under a condition that a facing direction of opposed two faces of the component body is defined as a first direction, a facing direction of other opposed two faces is defined as a second direction, and a facing direction of the remaining opposed two faces is defined as a third direction, and dimensions along the respective directions are defined as a first direction dimension, a second direction dimension and a third direction dimension, respectively, the first direction dimension, the second direction dimension and the third direction dimension of the component body satisfying a condition of second direction dimension>first direction dimension>third direction dimension, the external electrodes being of a five-face type having a first face portion formed on one face in the first direction of the component body, a second face portion and a third face portion formed on a part of two faces in the third direction of the component body, and a fourth face portion and a fifth face portion formed on a part of two faces in the second direction of the component body, at least one edge of the fourth face portion and the fifth face portion of the external electrode having a recess portion recessed from the edge toward the first face portion, both side portions in the third direction of the recess portion being covering portions which cover ridge portions of the two faces in the second direction of the component body.

19. The ceramic electronic component-mounting circuit board according to claim 18, wherein the external electrodes are connected to a conductive pad of the circuit board using solder.

* * * * *